Kirchstein, Kirchstein & Ottinger
ATTORNEYS

Kirschstein, Kirschstein & Ottinger
Attorneys

United States Patent Office 3,441,870
Patented Apr. 29, 1969

3,441,870

FREQUENCY SYNTHESIZER USING AUTOMATICALLY VARIED DIVISION FACTORS IN A PHASE-LOCKED LOOP

Reginald Gordon Wicker, Coventry, England, assignor to The General Electric Company Limited, London, England, a British company Filed Jan. 5, 1968, Ser. No. 696,091
Claims priority, application Great Britain, Jan. 5, 1967, 696/67
Int. Cl. H03b 3/04, 3/00
U.S. Cl. 331—11 12 Claims

ABSTRACT OF THE DISCLOSURE

A frequency synthesizer comprises a slave oscillator whose frequency is controlled via a control loop incorporating a variable factor divider whose output is compared in a comparator with a train of pulses of reference frequency. In order to obtain slave oscillator frequencies corresponding to fractional division factors of the divider, a control signal is applied to the slave oscillator from the comparator via a smoothing circuit so that the control signal has a value representative of the average value of the output of the comparator over a period corresponding to a plurality of successive counts by the divider, and means is provided for automatically setting the division factor of the divider at different values during each said period.

This invention relates to frequency synthesizers.

The invention relates particularly to frequency synthesizers of the kind comprising a variable frequency oscillator, a signal comparator, means for applying a first train of pulses of predetermined stable frequency to one input of the comparator, means for applying a second train of pulses, whose frequency is dependent on the frequency of the oscillator, to a second input of the comparator via a variable factor frequency divider of the kind comprising a cyclic counter, and means for utilising an output of the comparator to produce a control signal to control the frequency of the oscillator in such a manner as to tend to maintain the difference between the frequencies of the trains of pulses applied to the comparator substantially constant.

With such an arrangement the frequency of the oscillator may be varied by varying the factor by which the divider divides, the frequency of the oscillator changing by an amount equal to said stable frequency each time the division factor is changed by one. The resolution of the synthesizer is thus determined by the magnitude of the stable frequency.

Using conventional techniques to increase the resolution of a synthesizer of the kind specified over a given range of frequencies involves decreasing the magnitude of the stable frequency to a value equal to the required resolution, and increasing the number and magnitude of the division factors at which the variable divider can operate by a corresponding amount. This technique introduces the difficulty that since the frequencies of the input to, and hence the output from, the comparator are reduced, the short term stability of the variable frequency oscillator must be very good. In addition, the requirements imposed on the design of the variable factor divider may be almost impossible to satisfy if the frequency of the output of the synthesizer is required to be variable over a wide range.

It is an object of the present invention to provide a frequency synthesizer of the kind specified wherein a high resolution is obtained by a technique which considerably alleviates the above-mentioned difficulties.

According to the present invention a frequency synthesizer of the kind specified includes means for applying said control signal to said variable frequency oscillator via a smoothing circuit having a characteristic such that the output signal of the smoothing circuit has a value representative of the average value of said control signal over a period corresponding to a plurality of successive counting cycles of the divider, and means is provided to set the division factor of the divider automatically at different values for at least two counting cycles during each said period such that the effective division factor of the divider during each said period has a value intermediate between two successive possible settings of the divider.

One arrangement in accordance with the invention will now be described by way of example with reference to the accompanying drawings in which.

Figure 1:
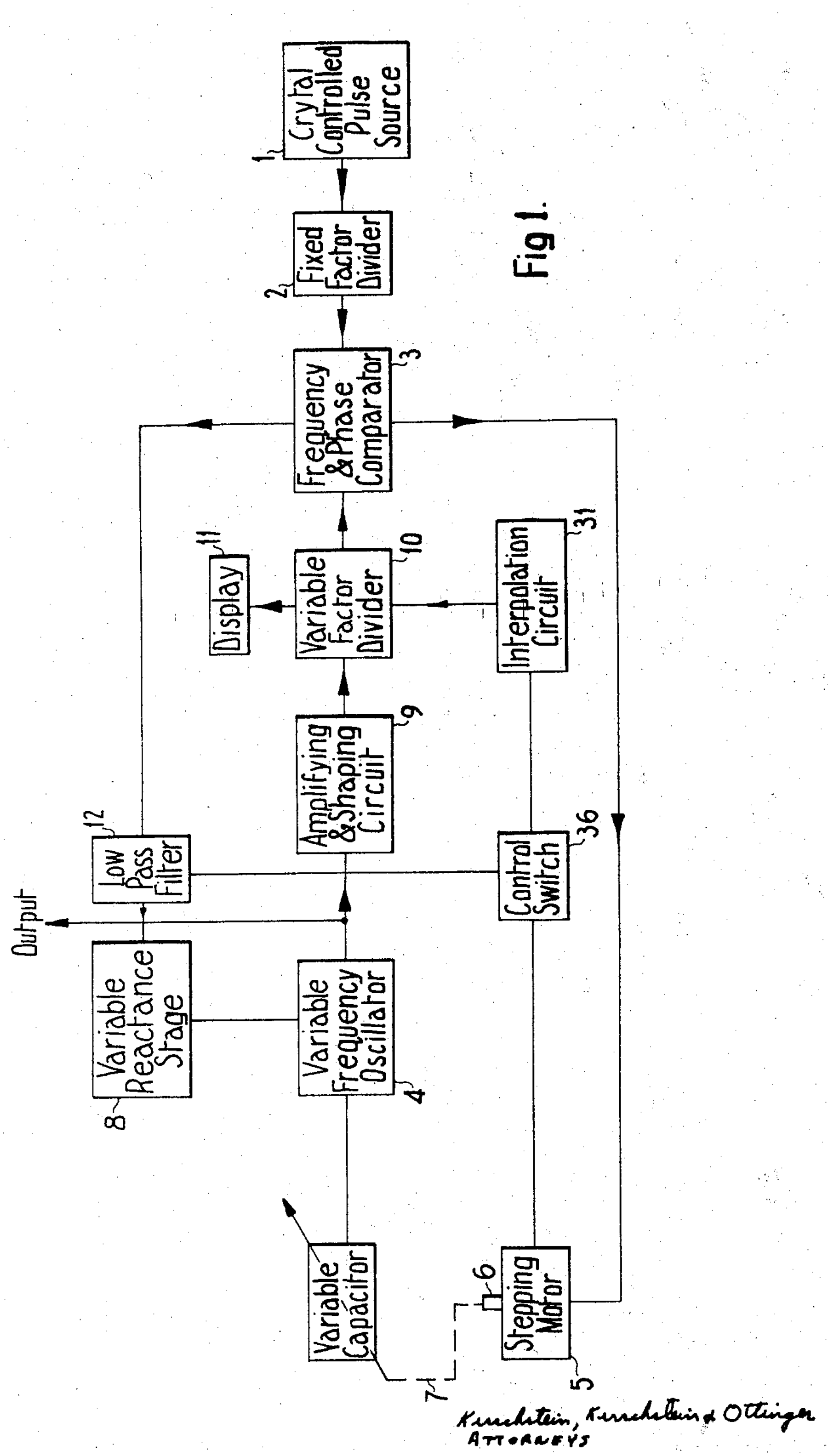
FIGURE 1 is a block schematic diagram of the synthesizer.

Referring to FIGURE 1, the synthesizer includes a crystal controlled pulse source 1 the output of which is fed to a fixed factor frequency divider 2 to produce a 1000 p./s. output which is fed to one input of a frequency and phase comparator 3.

The synthesizer also includes a variable frequency LC slave oscillator 4 from which the output of the synthesizer is derived. The slave oscillator 4 is provided with a coarse frequency control means comprising a stepping motor 5 whose shaft 6 is coupled to a variable capacitor 7 incorporated in a frequency determining circuit of the slave oscillator 4, and a fine frequency control means comprising a voltage controlled variable reactance stage 8 incorporated in the frequency determining circuit of the slave oscillator 4.

An output from the slave oscillator 4 is fed via an amplifying and shaping circuit 9 to a variable factor frequency divider 10 described in greater detail below. The variable divider 10 is associated with a display means 11, which indicates the frequency at which the slave oscillator 4 is operating and may suitably provide an in-line digital display using cold cathode indicator tubes.

The output of the variable factor divider 10 is fed to the other input of the comparator 3 and the comparator 3 provides two outputs one of which is indicative of the magnitude and sense of the difference between the frequencies of the two inputs to the comparator 3, and the other of which is indicative of the magnitude and sense of the phase difference between the two inputs when they are of the same frequency.

The frequency indicative output of the comparator 3 is utilised to control the operation of the stepping motor 5, and the phase indicative output of the compaartor 3 is fed to a low pass filter 12 effective to integrate over a period of about $1/10$ of a second to produce a D.C. voltage which is utilised to control the reactance stage 8.

In operation of the synthesizer, the input applied to the comparator 3 from the crystal controlled pulse source 1 via the fixed factor divider 2 has a frequency of 1000 c./s. The output voltages supplied by the comparator 3 are utilised to control the frequency of the slave oscillator 4 by means of the reactance stage 8 and variable capacitor 7 in such a manner as to reduce these output voltages substantially to zero. The frequency and phase of the output of the slave oscillator 4 is thus controlled so as to attain a frequency such that the input applied to the comparator 3 from the variable factor divider 10 is of the same frequency and phase as the input applied to the comparator 3 from the pulse source 1. The output of the slave oscillator 4 thus attains a frequency in cycles per second substantially equal to 1000 times the factor by which the variable factor divider 10 is set to divide.

Figure 2:
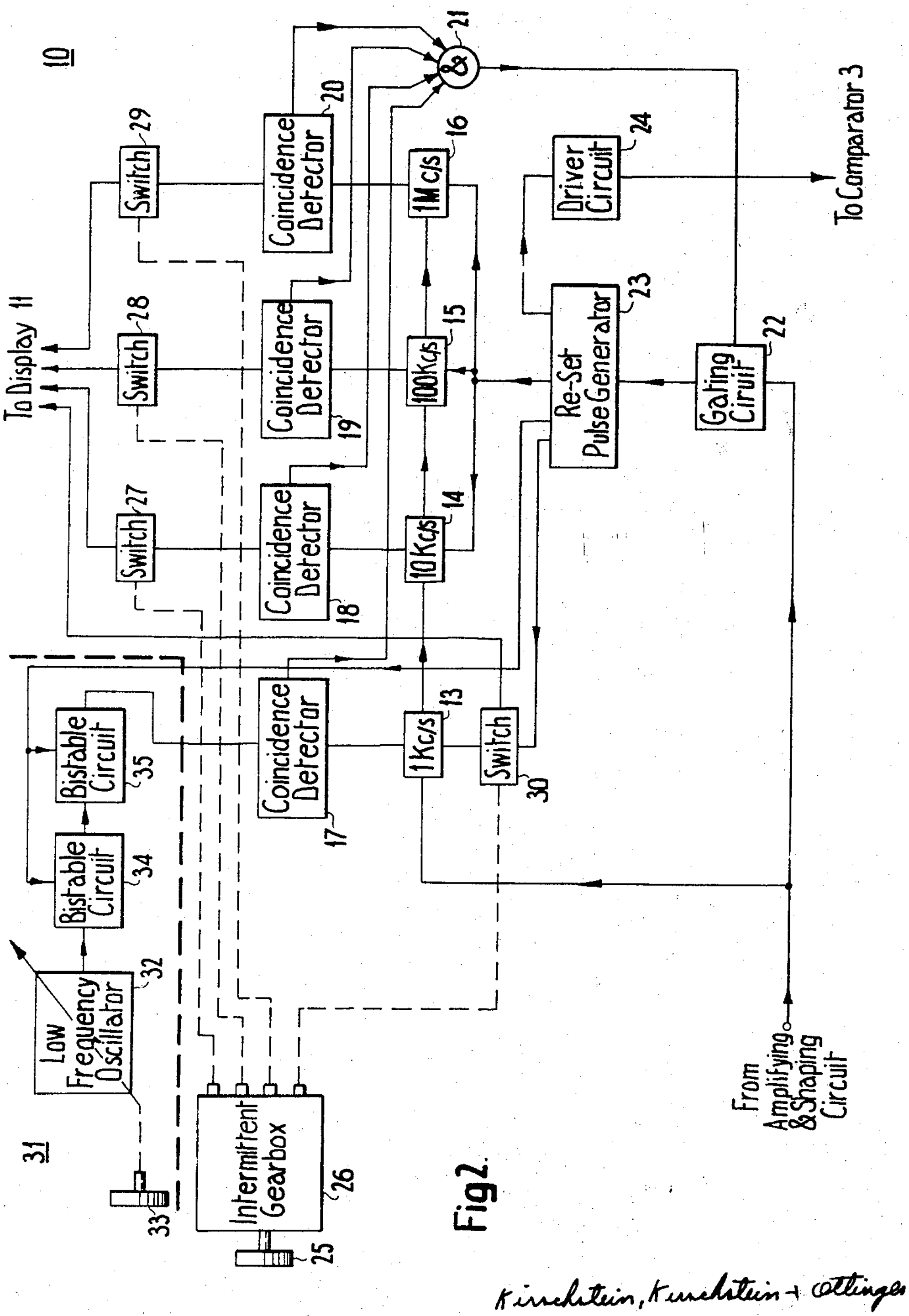
FIGURE 2 is a more detailed block schematic diagram of a part of the synthesizer shown in FIGURE 1.

Referring now to FIGURE 2, the variable factor divider 10 basically comprises a decade counter having four stages 13, 14, 15 and 16 connected in cascade.

Each stage 13, 14, 15 or 16 is associated with a respective coincidence detector 17, 18, 19 or 20 adapted to produce a negative-going output pulse when the associated counter stage 13, 14, 15 or 16 is at a predetermined count. The outputs of the detectors 17 to 20 are applied to an AND gate 21 so that a pulse appears at the output of the AND gate 21 when the counter as a whole is at a predetermined count.

The output of the AND gate 21 is applied to a gating circuit 22 where it is utilised to gate out a pulse from the input signal applied to the variable factor divider 10 from the amplifying and shaping circuit 9. The gated out pulses are fed to a pulse generator 23 which produces a pulse for re-setting the variable divider counter in response to each gated out pulse applied to it, the fastest counter stage 13 being reset to the complementary to nine of the required count for this stage 13 and the other stages 14, 15 and 16 being reset to zero. The reset period is arranged to occupy a time period equal to two input pulses to the divider 10; to allow for this the coincidence detector 17 associated with the fastest counter stage 13 is arranged to produce an output pulse when the fastest stage 13 is at a count of 7. Output pulses from the reset pulse generator 23 are also fed via a driver circuit 24 to the comparator 3 to provide the required input to the comparator 3 from the variable factor divider 10.

Variation of the setting of the variable divider 10 is achieved by means of a knob 25 which is coupled via an intermittent drive gearbox 26 to three switches 27, 28 and 29 which are respectively coupled to the three coincidence detectors 18, 19 and 20 associated with the three slower counter stages 14, 15 and 16. As the knob 25 is rotated, the predetermined count of these three counter stages 14, 15 and 16 at which the associated detectors 18, 19 and 20 respectively produce output pulses is progressively varied. Thus, by means of the knob 25 these three detectors 18, 19 and 20 can be set to produce coincident output pulses when the associated counter stages 14, 15 and 16 are at any desired setting from 100 to 999.

The knob 25 is additionally coupled to a switch 30 connected with the fastest counter stage 13 so that as the knob 25 is rotated the count to which this stage 13 is reset is progressively varied in step with the variation of the setting of the detectors 18, 19 and 20 associated with the three slower stages 14, 15 and 16. The variable divider 10 may thus be set by means of the knob 25 to divide by any integral factor between 1000 and 9999. For example, when a division factor of 6382 is required the knob 25 is adjusted so that the variable divider counter is reset to a count of 0007 and an output appears at the output of the AND gate 21 at a count of 6387. The frequency of the slave oscillator 4 may thus be varied in 1000 cycles per second steps through the range 1 megacycle per second ($1000 \times 1000$ c./s.) to 9.999 megacycles per second ($1000 \times 9999$ c./s.).

The display 11 is controlled by means of the switches 27 to 30 coupled to the knob 25, the display 11 being set to indicate the actual frequency of the slave oscillator 4, rather than the division factor of the variable divider 10.

Referring now to FIGURES 1 and 2, in order to allow the slave oscillator 4 to be tuned to frequencies intermediate the 1000 c./s. spaced apart frequencies obtainable by manipulation of the knob 25, the variable factor divider 10 is associated with an interpolation circuit 31.

The interpolation circuit 31 includes a low frequency oscillator 32 which is tunable by means of a knob 33 through the range 0 to 1000 cycles per second. Each cycle of the output of this oscillator 32 is utilized to trigger a bistable circuit 34 from its first stable state into its second stable state. The bistable circuit 34 is triggered back into its first stable state by the next pulse produced by the reset pulse generator 23 and operation of the bistable circuit 34 from its second to its first stable state is arranged to trigger a second bistable circuit 35 from its first stable state into its second stable state. The second bistable circuit 35 is also arranged to be triggered back into its first stable state by the next pulse produced by the reset pulse generator 23. Hence, during each second of time, that is, during each 1000 counting cycles of the divider 10, the bistable circuit 35 is in its second stable state for a number of counting cycles of the variable factor divider 10 equal to the frequency of the low frequency oscillator 32, but is otherwise in its first stable state.

The bistable circuit 35 is coupled with the coincidence detector 17 associated with the fastest counter stage 13, so that the detector 17 produces an output pulse at a count of 8 when the bistable stage 35 is in its second stable state and at a count of 7 when the bistable stage 35 is in its first stable state.

The interpolation circuit 31 is brought into operation by means of a control switch 36 which also serves to lock the stepping motor 5, and to alter the characteristics of the filter 12 so that it is effective to integrate over a period of 1 second instead of $\frac{1}{10}$ of a second.

When the interpolation circuit 31 is not in operation, the slave oscillator 4 stabilizes at a frequency equal to $n$ kc./s. where $n$ is the division factor of the variable divider 10 as set by the knob 25. With the interpolation circuit 31 in operation, during each 1000 counting cycles of the divider 10, the division factor of the divider 10 is increased by one for a number of counting periods equal to the frequency of the low frequency oscillator 32, as set by the knob 33. The output voltage of the filter 12 consequently assumes a steady value such that the slave oscillator 4 stabilizes at a frequency of $$n+\frac{m}{1000} \text{ kc./s.}$$

where $m$ is the frequency of the low frequency oscillator 32. The interpolation circuit 31 thus allows the frequency of the slave oscillator 4 to be increased by 1 kc./s. in 1 c./s. step from any frequency set by means of the knob 25.

It will be appreciated that while in the arrangement described above increased resolution is obtained by changing the division factor of the variable factor divider 10 between two adjacent numbers, in other arrangements in accordance with the invention the division factor may be changed between any two or more numbers.

I claim:

1. A frequency synthesizer comprising: a variable frequency oscillator; a signal comparator having first and second inputs and an output; means for applying a train of pulses of predetermined stable frequency to the first input of the comparator; a variable factor frequency divider of the kind comprising a cyclic counter; means for applying to the input of the divider a train of pulses whose frequency is dependent on the frequency of the variable frequency oscillator; means for applying to the second input of the comparator a signal whose frequency is dependent on the frequency of the output of said divider; and means for utilizing a control signal derived from the output of the comparator to control the frequency of the oscillator in such a manner as to tend to maintain the difference between the frequencies of the trains of pulses applied to the inputs of the comparator substantially equal; wherein the improvement comprises: a smoothing circuit; means for applying said control signal to said oscillator via said smoothing circuit, the smoothing circuit having a characteristic such that the output of the smoothing circuit is representative of the average value of said control signal over a period corresponding to a plurality of successive counting cycles of the divider; and means for automatically setting the division factor of the divider at different values for at least two counting cycles during each said period, whereby the effective division factor of the divider during each said period has a value intermediate between two successive possible settings of the divider.

2. A synthesizer according to claim 1 wherein said oscillator includes a frequency determining circuit including a coarse frequency control means and a fine frequency control means, and the output of the comparator provides a first output signal which is representative of the frequency difference between the inputs to the comparator and is utilized to control said coarse frequency control means, and a second output signal which is representative of the phase difference between the inputs to the comparator and is utilized to control said fine frequency control means, said control signal being constituted by said second output signal of the comparator.

3. A synthesizer according to claim 2 wherein said coarse frequency control means comprises a variable capacitor coupled to an electric stepping motor, and said fine frequency control means comprises a voltage controlled variable reactance stage.

4. A synthesizer according to claim 2 including means for locking the setting of said coarse frequency control means when said means for automatically setting the division factor of the divider is operative.

5. A synthesizer according to claim 1 including means for altering the characteristic of said smoothing circuit, when said means for automatically setting the division factor of the divider is rendered inoperative, so that the output signal of the smoothing circuit is then representative of the average value of said control signal over a time corresponding to a relatively small number of successive counting cycles of the divider.

6. A synthesizer according to claim 1 wherein said means for automatically setting the division factor of the variable divider sets the division factor of the variable divider at a first value for at least one counting cycle of the variable divider during each said period, and at a second value for all the other counting cycles of the variable divider during each said period.

7. A synthesizer according to claim 6 wherein said first and second values differ by one.

8. A synthesizer according to claim 6 wherein the number of counts of the variable divider during each said period for which the division factor has said first value is variable.

9. A synthesizer according to claim 8 wherein said means for automatically setting the division factor of the variable divider comprises: a second oscillator whose frequency is variable over a range of values below the frequency of said source of oscillations of relatively stable frequency; a first bistable circuit; means for operating said first bistable circuit from a first condition into a second condition once during each cycle of oscillation of said second oscillator; means for returning said first bistable circuit to its first condition, when in its second condition, in response to the occurrence of a predetermined point in the counting cycle of the variable divider; a second bistable circuit; means for operating said second bistable circuit from a first condition into a second condition in response to each change of the first bistable circuit from its second to its first condition; and means for returning said second bistable circuit to its first condition when in its second condition, in response to the occurrence of said predetermined point in the counting cycle of the variable divider; the division factor of the variable divider having said first or said second value in dependence on whether said second bistable circuit is in its first or its second condition.

10. A synthesizer according to claim 9 wherein the frequency of said second oscillator is variable substantially from zero to the frequency of said source of oscillations of relatively stable frequency.

11. A synthesizer according to claim 1 wherein said variable factor frequency divider comprises a plurality of counter stages connected in cascade and a plurality of coincidence detectors each of which is associated with a respective one of said counter stages and produces an output when the associated counter stage is at a predetermined count, and said means for automatically setting the division factor of the variable divider comprises means for automatically changing the count of the fastest counter stage at which the associated coincidence detector produces a said output.

12. A synthesizer according to claim 11 including control means for altering the count to which said fastest counter stage is reset at the end of each counting cycle of the divider, whereby the division factor of the divider may be set at different values.

References Cited

UNITED STATES PATENTS 3,217,267 11/1965 Loposer ---------- 331—17 X

ROY LAKE, *Primary Examiner.*

S. H. GRIMM, *Assistant Examiner.*

U.S. Cl. X.R.

331—13, 17, 18, 35